(12) United States Patent
Rokuhara (10) Patent No.: US 8,277,273 B2
(45) Date of Patent: Oct. 2, 2012

(54) METHOD OF PRODUCING ORGANIC ELECTROLUMINESCENCE ELEMENT, ORGANIC ELECTROLUMINESCENCE ELEMENT, AND LIGHTING DEVICE

(75) Inventor: Kouichi Rokuhara, Shimotsuma (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 12/935,367

(22) PCT Filed: Mar. 10, 2009

(86) PCT No.: PCT/JP2009/054572
§ 371 (c)(1),
(2), (4) Date: Sep. 29, 2010

(87) PCT Pub. No.: WO2009/122871
PCT Pub. Date: Oct. 8, 2009

(65) Prior Publication Data
US 2011/0025200 A1    Feb. 3, 2011

(30) Foreign Application Priority Data
Mar. 31, 2008    (JP) ................................. 2008-091566

(51) Int. Cl.
*H01J 9/00* (2006.01)
(52) U.S. Cl. ...................................................... 445/23
(58) Field of Classification Search ................... 313/504, 313/506; 445/23–25
See application file for complete search history.

(56) References Cited

U.S. PATENT DOCUMENTS

| 6,582,504 B1 | 6/2003 | Fujita |
| 7,695,800 B2 | 4/2010 | Amano et al. |
| 2004/0185188 A1 | 9/2004 | Amano et al. |
| 2008/0042582 A1 | 2/2008 | Masuda et al. |

FOREIGN PATENT DOCUMENTS

| CN | 1519797 A | 8/2004 |
| JP | 2001-155858 A | 6/2001 |
| JP | 2004-237545 A | 8/2004 |
| JP | 2004-322329 A | 11/2004 |
| JP | 2006-286243 A | 10/2006 |
| WO | 2005/122648 A1 | 12/2005 |

OTHER PUBLICATIONS

Office Action issued Sep. 7, 2011, in Chinese Patent Application No. 200980111499.0 with English translation.
Notice of Rejection, mailed May 15, 2012 from the Japanese Patent Office, in Japanese Patent Application No. 2008-091566, along with an English translation thereof.

*Primary Examiner* — Joseph L Williams
(74) *Attorney, Agent, or Firm* — Sughrue Mion, PLLC (57) ABSTRACT

A method of producing an organic EL element according to the present invention is a method of producing an organic electroluminescent element by stacking at least an anode, a cathode, and an organic light-emitting layer disposed between the anode and the cathode. The method includes an organic light-emitting layer formation step for forming the organic light-emitting layer by applying an organic light-emitting ink having an organic light-emitting material and a solvent to a light-emitting layer formation region on which the organic light-emitting layer is to be formed, by using a relief printing plate that has a relief portion in a shape corresponding to the shape of light-emitting layer formation region and has a plurality of grooves formed on a surface portion of the relief portion. According to the method of the present invention, coating unevenness when the region for forming a large area of organic light-emitting layer is coated with the organic light-emitting ink by using a relief printing method can be prevented, and thus the organic light-emitting layer with a uniform thickness can be formed.

2 Claims, 2 Drawing Sheets

METHOD OF PRODUCING ORGANIC ELECTROLUMINESCENCE ELEMENT, ORGANIC ELECTROLUMINESCENCE ELEMENT, AND LIGHTING DEVICE

CROSS REFERENCE TO RELATED APPLICATIONS

This application is a National Stage of International Application No. PCT/JP2009/054572, filed on Mar. 10, 2009, which claims priority from Japanese Patent Application No. 2008-091566, filed on Mar. 31, 2008, the contents of all of which are incorporated herein by reference in their entirety.

TECHNICAL FIELD

The present invention relates to a method of producing an organic electroluminescent element (hereinafter may be referred to as an organic EL element), an organic EL element obtained by using the production method, and a lighting device including the organic EL element. More particularly, the invention relates to a method of producing an organic EL element in which the occurrence of coating unevenness when a region for forming a large-area organic light-emitting layer is coated with an organic light-emitting ink by a relief printing method is prevented, so that the organic light-emitting layer can be formed to have a uniform thickness. The invention also relates to an organic EL element obtained by using the production method and to a lighting device including the organic EL element.

BACKGROUND ART

As is well known, an organic EL element has a basic structure including a first electrode (an anode or cathode), a second electrode (a cathode or anode), and an organic light-emitting layer provided between these electrodes. In such a structure, when a current is allowed to flow between the electrodes facing each other with the organic light-emitting layer interposed therebetween, the organic light-emitting layer emits light.

The applications of organic EL elements include display devices and lighting devices. In a display device, a plurality of organic EL elements are arranged on a substrate, and each organic EL element functions as a pixel (see, for example, Patent Document 1). The size of the organic EL elements for such a display device is determined according to the required resolution, and generally the width and length of each organic light-emitting layer used therein is of micrometer order. On the other hand, for a lighting device, it is not necessary to use such a small size of organic EL elements as in display devices, and one or a plurality of organic EL elements including an organic light-emitting layer of which width and length are of centimeter order are arranged on a substrate.

Patent Document 1 JP 2006-286243 A

DISCLOSURE OF INVENTION

Problems to be Solved by the Invention

In the above mentioned organic EL elements for display devices, since the size of light-emitting layer formation region on which the organic light-emitting layer is formed is very small in square-micrometer ($\mu m^2$) order, an organic light-emitting ink containing an organic light-emitting material can be uniformly applied to each pixel by using a relief printing method through proper setting for the concentration of the organic light-emitting ink, the printing speed and other parameters.

However, when compared with the case where the area of the light-emitting layer formation region of the organic EL element for a display device is, for example, about 100 $\mu m \times 100$ $\mu m$, the area of the light-emitting layer formation region of the organic EL element for a lighting device is about 1 cm×1 cm or more. Therefore, in the organic EL element for a lighting device, the organic light-emitting ink must be applied to a larger region, for example has to be applied to 10000 times or more the region for light-emitting layer formation of the organic EL element. In order to apply the organic light-emitting ink to such a large region, if the technique in the formation of the organic EL element for a display device is employed without any modification, that may cause coating unevenness in the light-emitting layer formation region. For this reason, the relief printing method that is used in a conventional way cannot be employed. Such coating unevenness develops considerably when the size of the light-emitting layer formation region exceeds 1 cm×1 cm.

If the coating unevenness occurs, the thickness of the organic light-emitting layer becomes irregular, then resulting in light emitting unevenness. In some cases, a light emission failure occurs, and the performance of the lighting device deteriorates considerably.

The present invention has been made in view of the above problem, and it is an object of the invention to provide a method of producing an organic EL element in which the occurrence of coating unevenness is prevented when an organic light-emitting ink is applied by a relief printing method to a region for forming a large-area organic light-emitting layer, so that the organic light-emitting layer can be formed to have a uniform thickness. It is also an object of the invention is to provide an organic EL element obtained by using the production method and to provide a lighting device including the organic EL element.

Means for Solving the Problem

To solve the above problem, the present invention provides a method of producing an organic electroluminescent element, an organic electroluminescent element, and a lighting device, configured as described below.

[1] A method of producing an organic electroluminescent element comprising at least an anode, a cathode, and an organic light-emitting layer placed between the cathode and the anode, the method comprising:

an organic light-emitting layer formation step for forming an organic light-emitting layer by applying an organic light-emitting ink comprising an organic light-emitting material and a solvent to a light-emitting layer formation region on which the organic light-emitting layer is to be formed, by using a relief printing plate that has a relief portion in a shape corresponding to the shape of light-emitting layer formation region and has a plurality of grooves formed on a surface portion of the relief portion.

[2] The method of producing an organic electroluminescent element according to the above [1], wherein at least one longitudinal end of the plurality of grooves opens in a side surface of the relief portion.

[3] The method of producing an organic electroluminescent element according to the above [1] or [2], wherein the area of the light-emitting layer formation region is 1 cm×1 cm or more.

[4] An organic electroluminescent element obtained by using the method of producing an organic electroluminescent element according to any one of the above [1] to [3].

[5] A lighting device comprising the organic electroluminescent element according to any one of the above [1] to [4].

Effects of the Invention

According to the present invention, it is possible to efficiently produce an organic EL element that exhibits an excellent light-emission characteristic of preventing light emitting unevenness or light-emission failure on its light-emitting surface, and produce a lighting device including the organic EL element.

DESCRIPTION OF REFERENCE NUMERALS

| 3 | organic light-emitting ink |
|---|---|
| 11 | relief printing plate |
| 12 | relief portion |
| 12a | ridge |
| 12b | groove |

BEST MODE(S) FOR CARRYING OUT THE INVENTION

A structure of an organic EL element which is an object of the method of the present invention is described below, and then the method of producing the organic EL element according to the present invention is described in more detail. The obtained organic EL element may be used for, for example, a lighting device. In the following description, the scale of each component in the drawings may be different from the actual scale.

(Substrate)

As the substrate for the organic EL element, any substrate that is unchanged when the electrodes and the organic material layer are formed may be used. Examples of such a substrate may include glass, plastic, polymer film, and a silicon substrate and a stacked body thereof. A substrate obtained by subjecting a plastic, polymer, or similar film to treatment for reducing water permeability may be used. A commercially available substrate may be used as the substrate, and the substrate may be produced by a known method.

(Electrodes and Organic Light-Emitting Layer)

The organic EL element is formed by stacking at least an anode, a cathode, and an organic light-emitting layer placed between the cathode and anode. At least one of the anode and the cathode is an electrode having light transmittance. A low molecular or a macromolecular organic light-emitting material or both are employed for the light-emitting layer. In the organic EL element in the present invention, the organic light-emitting layer is formed by a relief printing, and therefore a macromolecular organic light-emitting material is suitable for the organic light-emitting material for the organic light-emitting layer.

In the organic EL element, a plurality of light-emitting layers may be provided between the anode and the cathode, and further a layer other than the light-emitting layer may be provided between the anode and the cathode. Hereinafter, a layer provided between the cathode and the light-emitting layer may be referred to as a cathode-side interlayer, and a layer provided between the anode and the light-emitting layer may be referred to as an anode-side interlayer.

Examples of the anode-side interlayer provided between the anode and the light-emitting layer may include a hole injection layer, a hole transport layer, and an electron blocking layer.

The hole injection layer has a function of improving hole injection efficiency from the cathode. The hole transport layer has a function of improving hole injection from a hole injection layer or a layer (hole transport layer) closer to the anode. When the hole injection layer or the hole transport layer has a function of blocking transport of electrons, these layers may be referred to as electron blocking layers. Whether or not these layers have a function of blocking transport of electrons can be determined, for example, by producing an element that allows only electron current to flow therethrough and measuring the reduction in the current value to examine the effects of blocking.

Examples of the cathode-side interlayer provided between the cathode and the light-emitting layer may include an electron injection layer, an electron transport layer, and a hole blocking layer.

The electron injection layer has a function of improving election injection efficiency from the cathode. The electron transport layer has a function of improving election injection from the electron injection layer or a layer (electron transport layer) closer to the cathode. When the electron injection layer or the electron transport layer has a function of blocking transport of holes, these layers may be referred to as hole blocking layers. Whether or not these layers have a function of blocking transport of holes can be determined, for example, by producing an element that allows only hole current to flow therethrough and measuring the reduction in the current value to examine the effects of blocking.

Examples of the layered structure of the layers provided between the anode and cathode may include: a structure in which a hole transport layer is disposed between the anode and the light-emitting layer; a structure in which an electron transport layer is disposed between the cathode and the light-emitting layer; and a structure in which an electron transport layer is disposed between the cathode and the light-emitting layer and also a hole transport layer is disposed between the anode and the light-emitting layer. Specific examples may include the following layered structures a) to d):

a) anode/light-emitting layer/cathode;
b) anode/hole transport layer/light-emitting layer/cathode;
c) anode/light-emitting layer/electron transport layer/cathode; and
d) anode/hole transport layer/light-emitting layer/electron transport layer/cathode.

(The symbol "/" denotes that the layers are stacked adjacent to each other. The same is applied to the following description.)

In the above structures, the light-emitting layer has a function of emitting light; the hole transport layer has a function of transporting holes; and the electron transport layer has a function of transporting electrons, as described above. The electron transport layer and the hole transport layer may be collectively referred to as charge transport layers. Two or more light-emitting layers, two or more hole transport layers, and two or more electron transport layers may be used, and the number of these layers may be set independently. Among the charge transport layers provided adjacent to the electrodes, a layer having a function of improving charge injection efficiency from an electrode and an effect of reducing the driving voltage of the element may be particularly referred to as a charge injection layer (hole injection layer or electron injection layer).

In order to improve the adhesion properties with an electrode and to improve charge injection from the electrode, the charge injection layer or an insulating layer having a thickness of 2 nm or less may be provided further adjacent to the electrode. In addition, in order to improve the adhesion properties of the interface of any of the charge transport layers and the light-emitting layer or to prevent mixing the interface thereof, a thin buffer layer may be inserted into the interface. The order, number, and thicknesses of the stacked layers may be appropriately set in consideration of light emission efficiency and the life of the element.

Examples of the organic EL element including a charge injection layer (electron injection layer or hole injection layer) may include: an organic EL element including a charge injection layer disposed adjacent to the cathode; and an organic EL element including a charge injection layer disposed adjacent to the anode. Specific examples may include the following structures e) to p):
e) anode/charge injection layer/light-emitting layer/cathode;
f) anode/light-emitting layer/charge injection layer/cathode;
g) anode/charge injection layer/light-emitting layer/charge injection layer/cathode;
h) anode/charge injection layer/hole transport layer/light-emitting layer/cathode;
i) anode/hole transport layer/light-emitting layer/charge injection layer/cathode;
j) anode/charge injection layer/hole transport layer/light-emitting layer/charge injection layer/cathode;
k) anode/charge injection layer/light-emitting layer/charge transport layer/cathode;
l) anode/light-emitting layer/electron transport layer/charge injection layer/cathode;
m) anode/charge injection layer/light-emitting layer/electron transport layer/charge injection layer/cathode;
n) anode/charge injection layer/hole transport layer/light-emitting layer/charge transport layer/cathode;
o) anode/hole transport layer/light-emitting layer/electron transport layer/charge injection layer/cathode; and
p) anode/charge injection layer/hole transport layer/light-emitting layer/electron transport layer/charge injection layer/cathode.

(Anode)

The anode is, for example, a transparent electrode or a semi-transparent electrode, and a thin film of a metal oxide, metal sulfide, or metal having high electric conductivity may be used as the anode. A thin film having high light-transmittance is preferably used, and a suitable thin film is appropriately selected depending on the organic layer used. Specific examples of the thin film may include thin films of indium oxide, zinc oxide, tin oxide, indium-tin oxide (abbreviated as ITO), indium-zinc oxide (abbreviated as IZO), gold, platinum, silver, and copper. Among these, ITO, IZO, and tin oxide are preferably used.

Organic transparent conductive films made of a material such as polyaniline and derivatives thereof, and polythiophene and derivatives thereof may be use as the anode. In addition, a thin film made of a mixture containing at least one selected from the group consisting of the materials used for the organic transparent conductive films, metal oxides, metal sulfides, metals and carbon materials such as carbon nanotubes may be used as the anode.

A material that reflects light may be used for the anode, and preferred examples of such a material may include metals, metal oxides, and metal sulfides, having a work function of 3.0 eV or more.

The method of producing the anode may be vacuum deposition, sputtering, ion plating, plating methods or the like.

The thickness of the anode may be appropriately selected in consideration of its light transmittance and electric conductivity. The thickness is, for example, 5 nm to 10 μm, preferably 10 nm to 1 μm, and more preferably 20 nm to 500 nm.

(Anode-Side Interlayer)

If necessary, an anode-side interlayer such as a hole injection layer or a hole transport layer is stacked between the anode and the light-emitting layer, as described above.

(Hole Injection Layer)

As described above, the hole injection layer may be provided between the anode and the hole transport layer or between the anode and the light-emitting layer. No particular limitation is imposed on the material that forms the hole injection layer, and any known material may be appropriately used. Examples of such a material may include phenylamine-based materials, starburst amine-based materials, phthalocyanine-based materials, hydrazone derivatives, carbazole derivatives, triazole derivatives, imidazole derivatives, oxadiazole derivatives having amino groups, oxides such as vanadium oxide, tantalum oxide, tungsten oxide, molybdenum oxide, ruthenium oxide, and aluminum oxide, amorphous carbon, polyaniline, and polythiophene derivatives.

The thickness of the hole injection layer is preferably about 5 to about 300 nm. When the thickness is less than 5 nm, its production tends to be difficult. On the other hand, when the thickness exceeds 300 nm, the driving voltage and the voltage applied to the hole injection layer tend to be large.

(Hole Transport Layer)

No particular limitation is imposed on the material that forms the hole transport layer. Examples of such a material may include: aromatic amine derivatives such as N,N'-diphenyl-N,N'-di(3-methylphenyl)4,4'-diaminobiphenyl (TPD) and 4,4'-bis[N-(1-naphthyl)-N-phenylamino]biphenyl (NPB); polyvinylcarbazole and derivatives thereof; polysilane and derivatives thereof; polysiloxane derivatives having an aromatic amine in their side chain or main chain; pyrazoline derivatives; arylamine derivatives; stilbene derivatives; triphenyldiamine derivatives; polyaniline and derivatives thereof; polythiophene and derivatives thereof; polyarylamine and derivatives thereof; polypyrrole and derivatives thereof; poly(p-phenylene vinylene) and derivatives thereof; and poly(2,5-thienylene vinylene) and derivatives thereof.

Among these, polymer hole transport materials are preferably used as the hole transport material used for the hole transport layer. Such polymer hole transport materials may include polyvinylcarbazole and derivatives thereof, polysilane and derivatives thereof, polysiloxane derivatives having an aromatic amine compound group in their side chain or main chain, polyaniline and derivatives thereof, polythiophene and derivatives thereof, polyarylamine and derivatives thereof, poly(p-phenylene vinylene) and derivatives thereof, and poly(2,5-thienylene vinylene) and derivatives thereof. More preferred are polyvinylcarbazole and derivatives thereof, polysilane and derivatives thereof, and polysiloxane derivatives having an aromatic amine in their side chain or main chain. When a low-molecular hole transport material is used, it is preferable that the transport material be dispersed in a polymer binder.

No particular limitation is imposed on the thickness of the hole transport layer. The thickness may be appropriately changed according to the intended design and is preferably about 1 to about 1000 nm. When the thickness is less than the lower limit, its production tends to be difficult, or sufficient effects of hole transport tend not to be obtained. When the thickness exceeds the above upper limit, the driving voltage and the voltage applied to the hole transport layer tend to be large. Therefore, the thickness of the hole transport layer is preferably 1 to 1000 nm, as described above, more preferably 2 nm to 500 nm, and more preferably 5 nm to 200 nm.

(Organic Light-Emitting Layer)

The organic light-emitting layer usually contains an organic compound (a low-molecular compound or a macromolecular compound) that mainly emits fluorescence or phosphorescence. The organic light-emitting layer may further contain a dopant material. Examples of the material that forms the organic light-emitting layer used in the present invention may include the following dye-based materials, metal complex-based materials, polymer-based materials, and dopant materials.

Examples of the dye-based materials may include cyclopendamine derivatives, tetraphenyl butadiene derivative compounds, triphenylamine derivatives, oxadiazole derivatives, pyrazoloquinoline derivatives, distyrylbenzene derivatives, distyrylarylene derivatives, quinacridone derivatives, coumarin derivatives, pyrrole derivatives, thiophene ring compounds, pyridine ring compounds, perinone derivatives, perylene derivatives, oligothiophene derivatives, oxadiazole dimer, and pyrazoline dimer.

Examples of the metal complex-based material may include: metal complexes that emit light from a triplet excitation state, for example, iridium complexes and platinum complexes; and metal complexes having a central metal such as Al, Zn, Be or rare earth metals (such as Tb, Eu and Dy) and a ligand such as oxadiazole, thiadiazole, phenylpyridine, phenylbenzimidazole, and a quinoline structure, for example, an aluminum quinolinol complex, a benzoquinolinol beryllium complex, a benzoxazolyl zinc complex, a benzothiazole zinc complex, an azomethyl zinc complex, a porphyrin zinc complex, and europium complexes.

Examples of the polymer-based material include poly-p-phenylene vinylene derivatives, polythiophene derivatives, poly-p-phenylene derivatives, polysilane derivatives, polyacetylene derivatives, polyfluorene derivatives, polyvinylcarbazole derivatives, and polymerized products of the above dye-based materials or metal complex-based light-emitting materials.

Among the above organic light-emitting layer-forming materials, examples of blue light-emitting materials may include distyrylarylene derivatives and polymerized products thereof, oxadiazole derivatives and polymerized products thereof, polyvinylcarbazole derivatives, poly-p-phenylene derivatives, and polyfluorene derivatives. Specifically, polymer materials such as polyvinylcarbazole derivatives, poly-p-phenylene derivatives, and polyfluorene derivatives are preferred.

Among the above organic light-emitting layer-forming materials, examples of green light-emitting materials may include quinacridone derivatives and polymerized products thereof, coumarin derivatives and polymerized products thereof, poly-p-phenylene vinylene derivatives, and polyfluorene derivatives. Specifically, polymer materials such as poly-p-phenylene vinylene derivatives and polyfluorene derivatives are preferred.

Among the above light-emitting layer-forming materials, examples of red light-emitting materials may include coumarin derivatives and polymerized products thereof, thiophene ring compounds and polymerized products thereof, poly-p-phenylene vinylene derivatives, polythiophene derivatives, and polyfluorene derivatives. Specifically, polymer materials such as poly-p-phenylene vinylene derivatives, polythiophene derivatives, and polyfluorene derivatives are preferred.

For the purpose of, for example, improving the light-emission efficiency and changing the wavelength of emitted light, a dopant may be added to the organic light-emitting layer. Examples of the dopant may include perylene derivatives, coumarin derivatives, rubrene derivatives, quinacridone derivatives, squalium derivatives, porphyrin derivatives, styryl-based dyes, tetracene derivatives, pyrazolone derivatives, decacyclene, and phenoxazone.

The thickness of such an organic light-emitting layer is usually 2 nm to 200 nm.

(Cathode-Side Interlayer)

As described above, if necessary, a cathode-side interlayer such as an electron injection layer or an electron transport layer is stacked between the light-emitting layer and the cathode described later.

(Electron Transport Layer)

As the material for forming the electron transport layer, any known electron transport material may be used as the material for forming the electron transport layer. Examples of such a material may include oxadiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, 8-hydroxyquinoline and metal complexes of derivatives thereof, polyquinoline and derivatives thereof, polyquinoxaline and derivatives thereof, and polyfluorene and derivatives thereof.

Among these, oxadiazole derivatives, benzoquinone and derivatives thereof, anthraquinone and derivatives thereof, 8-hydroxyquinoline and metal complexes of derivatives thereof, polyquinoline and derivatives thereof, polyquinoxaline and derivatives thereof, and polyfluorene and derivatives thereof are preferably used. More preferable are 2-(4-biphenylyl)-5-(4-t-butylphenyl)-1,3,4-oxadiazol, benzoquinone, anthraquinone, tris(8-quinolinol)aluminum, and polyquinoline.

(Electron Injection Layer)

As described above, the electron injection layer is provided between the electron transport layer and the cathode or between the light-emitting layer and the cathode. The electron injection layer to be used may include: alkali metals; alkaline-earth metals; alloys containing at least one of these metals; oxides, halides, and carbonates of these metals; mixtures of these materials, according to the type of the light-emitting layer.

Examples of the alkali metals, and the oxides, halides and carbonates thereof may include lithium, sodium, potassium, rubidium, cesium, lithium oxide, lithium fluoride, sodium oxide, sodium fluoride, potassium oxide, potassium fluoride, rubidium oxide, rubidium fluoride, cesium oxide, cesium fluoride, and lithium carbonate.

Examples of the alkaline-earth metals, and the oxides, halides and carbonates thereof may include magnesium, calcium, barium, strontium, magnesium oxide, magnesium fluoride, calcium oxide, calcium fluoride, calcium fluoride, barium oxide, barium fluoride, strontium oxide, strontium fluoride, and magnesium carbonate.

Organic metal compounds doped with a metal, a metal oxide or a metal salt, organic metal complex compounds, and mixtures thereof may also be used as the material for the electron injection layer.

The electron injection layer may have a layered structure formed by stacking two or more layers. Specific examples of the layered structure may include Li/Ca and the like. The electron injection layer is formed by, for example, vapor deposition, sputtering, or a printing method.

The thickness of the electron injection layer is preferably about 1 nm to about 1 μm.

(Cathode)

As the material for the cathode, a material which has a small work function and can easily inject electrons to the light-emitting layer and/or a material having high electric conductivity and/or a material having high reflectivity of visible light is preferred. Specific examples of the cathode material may include metals, metal oxides, alloys, graphite, intercalated graphite, and inorganic semiconductors such as zinc oxide (ZnO).

Examples of the metals may include alkali metals, alkaline-earth metals, transition metals, and group 13 metals in the periodic table. Specific examples of the metals include lithium, sodium, potassium, rubidium, cesium, beryllium, magnesium, calcium, strontium, barium, gold, silver, platinum, copper, manganese, titanium, cobalt, nickel, tungsten, tin, aluminum, scandium, vanadium, zinc, yttrium, indium, cerium, samarium, europium, terbium, and ytterbium.

Examples of the alloys may include alloys containing at least one of the above metals. Specific examples of the alloys may include a magnesium-silver alloy, a magnesium-indium alloy, a magnesium-aluminum alloy, an indium-silver alloy, a lithium-aluminum alloy, a lithium-magnesium alloy, a lithium-indium alloy, and a calcium-aluminum alloy.

The cathode is a transparent electrode or a semi-transparent electrode according to need. Examples of the material for the cathode may include: conductive oxides such as indium oxide, zinc oxide, tin oxide, ITO, and IZO; and conductive organic materials such as polyaniline and derivatives thereof and polythiophene and derivatives thereof.

The cathode may have a layered structure having two or more layers. The electron injection layer may be used as the cathode.

The thickness of the cathode is appropriately selected in consideration of electrical conductivity and durability. The thickness is, for example, 10 nm to 10 μm, preferably 20 nm to 1 μm, and more preferably 50 nm to 500 nm.

(Upper Sealing Film)

After the cathode is formed in the manner described above, an upper sealing film for protecting a light-emitting function unit having a basic structure of anode/light-emitting layer/cathode is formed so as to seal the light-emitting function unit. The upper sealing film usually comprises at least one inorganic layer and at least one organic layer. The number of stacked layers is determined according to need. The inorganic layers and the organic layers are basically stacked alternately.

Even if the light-emitting function unit is covered with a substrate and the upper sealing film, the light-emitting material in the organic light-emitting layer is easily oxidized and also easily degraded in contact with water since the plastic substrate has higher permeability of gas and liquid than that of the glass substrate. Therefore, when the plastic substrate is used for the above substrate, a lower sealing film having high barrier properties against gas and liquid is stacked on the plastic substrate, and then the light-emitting function unit is stacked on the lower sealing film. The lower sealing film usually has a structure similar to the structure of the upper sealing film and is formed of a material similar to the material for the upper sealing film.

[Method of Producing Organic EL Element]

Hereinafter, the method of producing an organic EL element according to the present invention is described in more detail.

(Anode Forming Step)

A substrate formed of any of the above substrate materials is prepared. When a plastic substrate having high gas and liquid permeability is used, a lower sealing film is formed on the substrate in advance if necessary.

Next, an anode is patterned to be formed on the prepared substrate by using any of the above anode materials. When the anode is a transparent electrode, any of the above transparent electrode materials such as ITO, IZO, tin oxide, zinc oxide, indium oxide, and zinc-aluminum complex oxide is used. When ITO is used for example, the electrode patterning is performed by forming a uniform deposition film on the substrate by a sputtering method and then patterning it by using photolithography.

(Step of Forming Light-Emitting Layer Formation Regions)

In a certain case, a partition wall is formed through formation of an insulating film on the substrate that the anode has been formed thereon and following patterning to the insulating film, the partition wall surrounding a light-emitting layer formation region as viewed from a thickness direction of the substrate. The light-emitting layer formation region corresponds to a light-emitting region. When the organic EL element is used as the light source of a lighting device, the light-emitting layer formation region (light-emitting region) is generally formed to have an area of 0.5 cm×0.5 cm or more.

When a plurality of organic EL elements are formed on the substrate, the role of the insulating film is to ensure electrical insulation between the organic EL elements and to define the light-emitting regions. Therefore, the thickness of the insulating film is usually set to 0.1 to 0.2 μm.

The insulating film is usually produced by photolithography using a photosensitive material (photoresist composition).

Any coating methods using such as a spin coater, bar coater, roll coater, die coater, gravure coater or slit coater may be used to apply the photosensitive material (photoresist composition).

The insulating photosensitive material that forms the insulating film may be a positive resist or a negative resist. More specifically, any of photosensitive compounds such as polyamide-based, acrylic resin-based, and novolac resin-based photosensitive compounds may be used as the photosensitive material having insulating properties. To improve the display performance of the organic EL element, a material having light-blocking properties may be added to the photosensitive material.

To impart ink repellency to the surface of the insulating film, an ink repellent material may be added to the photosensitive material for forming the partition walls. Alternatively, after the insulating film is formed, the surface thereof may be coated with an ink repellent material to impart ink repellency to the surfaces of the partition walls. It is preferable that the ink repellency to the surfaces of the partition walls performs not only to an ink for the interlayers but also an ink for the organic light-emitting layer (those inks are described later).

(Anode-Side Interlayer Formation Step)

After the insulating partition walls are formed, an organic material layer (anode-side interlayer) such as the hole transport layer described above is formed, as appropriate.

No particular limitation is imposed on the method of depositing the anode-side interlayer. Examples of the deposition method using a low-molecular weight material may include a deposition method using a solution mixture of the low-molecular weight material and a polymer binder. Examples of the deposition method using a high-molecular weight material may include a deposition method using a solution.

No particular limitation is imposed on the solvent used for deposition using a solution, so long as the solvent can dissolve the material for the above-mentioned anode-side interlayer. Examples of such a solvent may include: chlorine-based solvents such as chloroform, methylene chloride, and dichloroethane; ether-based solvents such as tetrahydrofuran; aromatic hydrocarbon-based solvents such as toluene and xylene; ketone-based solvents such as acetone and methyl ethyl ketone; and ester-based solvents such as ethyl acetate, butyl acetate, and ethyl cellosolve acetate.

Preferably, relief printing methods are used as the deposition method using a solution. Among them, a flexographic printing method is particularly suitable.

As the above polymer binder to be mixed, a binder that does not excessively inhibit charge transport is preferred, and a binder that does not strongly absorb visible light is also preferably used. Examples of such a polymer binder may include polycarbonate, polyacrylate, polymethylacrylate, polymethylmethacrylate, polystyrene, polyvinylchloride, and polysiloxane.

(Organic Light-Emitting Layer Formation Step)

Figure 1:
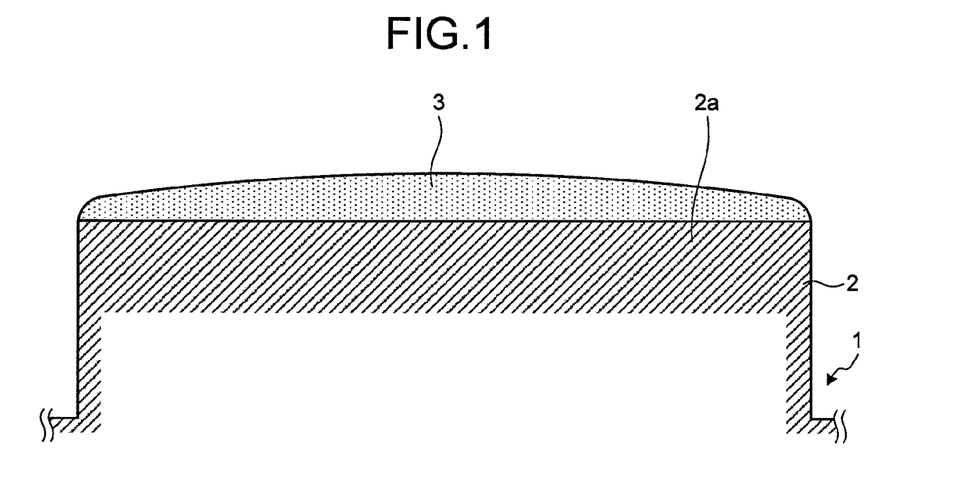
FIG. 1 is a cross-sectional view illustrating the surface structure of a relief portion of a relief printing plate used to form an organic light-emitting layer in the conventional production of an organic EL element.

In an organic light-emitting layer formation step in a conventional method of producing an organic EL element, as shown in FIG. 1, a relief surface 2a of a relief portion 2 of a relief printing plate 1 is formed to have a shape and dimensions that correspond to those of the region for forming the organic light-emitting layer. An organic light-emitting ink 3 is applied to the convex surfaces 2a, and then transferred to the region for forming the organic light-emitting layer.

On the other hand, the organic light-emitting layer formation step in the method of producing an organic EL element of the present invention is characterized as follows. The organic light-emitting layer is formed by applying an organic light-emitting ink comprising an organic light-emitting material and a solvent to the light-emitting layer formation region by using a relief printing plate 11 shown in FIG. 2. This relief printing plate 11 has a relief portion 12 having a shape corresponding to the shape of light-emitting layer formation region on which the organic light-emitting layer is to be formed. The relief portion 12 has a plurality of grooves 12b formed on the surface of the relief portion. Preferably, on the surface of the relief portion 12, the plurality of grooves 12b are arranged in a stripe pattern at predetermined intervals in the short-side direction. More preferably, the predetermined intervals are regular intervals. The short-side direction means the direction that extends perpendicular to the depth line of the groove and to the extending direction of the groove (the longitudinal direction). A portion between grooves 12b arranged adjacent to each other is referred to as a ridge 12a. Therefore, the width of each ridge 12a, described later, corresponds to the predetermined interval or the regular interval described above. Since the plurality of grooves 12b are arranged in a strip pattern at predetermined intervals in the short-side direction, the grooves 12b and the ridges 12a are formed alternately on the surface of the relief portion. The shape corresponding to the shape of the light-emitting layer formation region means that the outline of the surface of the relief portion 12 is substantially the same as the outline of the light-emitting layer formation region.

Figure 2:
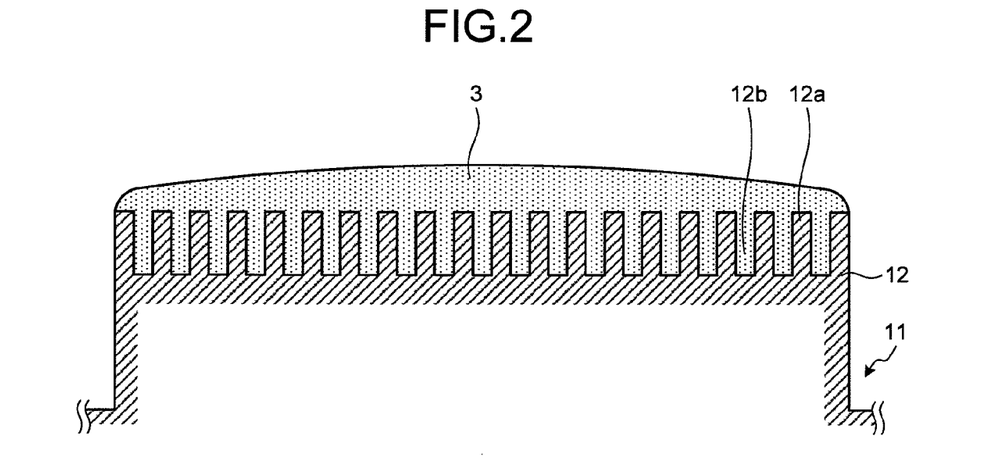
FIG. 2 is a cross-sectional view illustrating the surface structure of the relief portion of a relief printing plate used to form an organic light-emitting layer in the production of an organic EL element of the present invention.

The ridges 12a and the grooves 12b may or may not be arranged at regular intervals. Preferably, a plurality of grooves are formed on the surface of the relief portion so as to be arranged in a stripe pattern at regular intervals in the short-side direction. Preferably, at least one longitudinal end of the plurality of grooves 12b opens in a side surface of the relief portion 12. More specifically, it is preferable that at least one longitudinal end of the plurality of grooves 12b reaches a side surface of the relief portion 12. It is more preferable that the plurality of grooves 12b are formed on the surface portion of the relief portion 12 so as to extend between both of side surfaces of the relief portion 12. Since at least one longitudinal end of grooves 12b opens, it is presumed that negative pressure generated during transfer of the organic light-emitting ink can be reduced.

No particular limitation is imposed on the preferable sizes of the ridges 12a and the grooves 12b. The preferable sizes of the lines and spaces in the stripe pattern, and the sizes are appropriately set according to the concentration and viscosity of the ink and the evaporation rate of the solvent. A description is now given with reference to FIG. 3. The height h of the ridges 12a (the depth of the recessed grooves 12b) is preferably 5 μm to 50 μm; the width of the ridges 12a (the width of the lines) is preferably 10 μm to 100 μm; and the width of the grooves 12b (the width of the spaces, the short-side direction width of the grooves) is preferably 10 μm to 100 μm.

Figure 3:
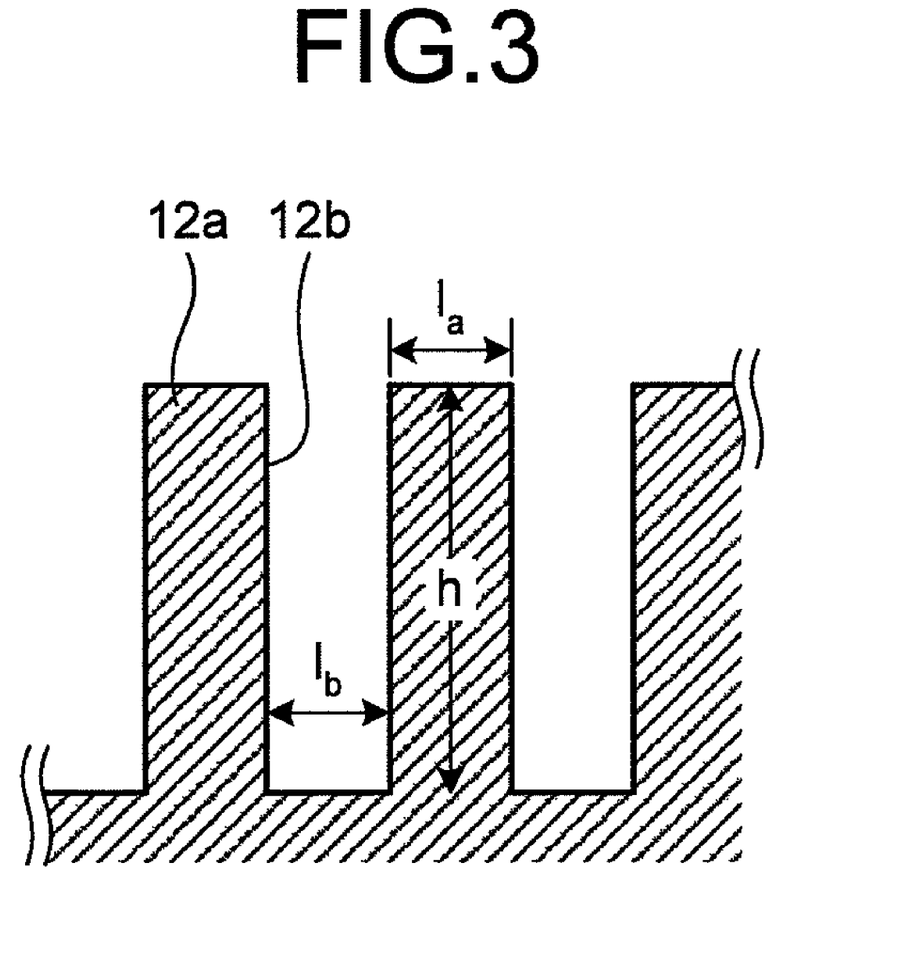
FIG. 3 is an enlarged cross-sectional view of the structure of the surface of the relief portion of the relief printing plate shown in FIG. 2.

No particular limitation is imposed on the longitudinal direction of the grooves 12b, that is, the direction of forming the stripes. Preferably, this longitudinal direction is parallel to the printing direction of the relief printing.

The organic light-emitting ink is prepared by dissolving or stably dispersing the organic light-emitting material in a solvent. Examples of the solvent for dissolving or dispersing the organic light-emitting material may include: single solvents such as toluene, xylene, acetone, anisole, methyl ethyl ketone, methyl isobutyl ketone, and cyclohexanone; and solvent mixtures thereof. Among these, aromatic organic solvents such as toluene, xylene, and anisole are preferred because they have favorable dissolvability of the organic light-emitting material.

If necessary, a surfactant, an antioxidant, a viscosity modifier, an UV absorber, and the like may be added to the organic light-emitting material ink.

The area of the light-emitting layer formation region is preferably 1 cm×1 cm or more. Even for such a large area, the organic light-emitting ink can be applied uniformly, and thus an organic EL element having a large light-emitting area can be easily produced by using the coating method.

(Cathode-Side Interlayer Formation Step)

After the organic light-emitting layer is formed, a cathode-side interlayer such as a hole transport layer or a hole injection layer is formed, if necessary.

No particular limitation is imposed on the method of forming the cathode-side interlayer when this interlayer is an electron transport layer. When a low-molecular electron transport material is used, examples of the method may include vacuum deposition using power and deposition from a solution or molten state material. When a high-molecular weight of electron transport material is used, examples of the method may include deposition from a solution or molten state material. When deposition from a solution or molten state material is used, a polymer binder may also be used at the same time. To deposit the electron transport layer using a solution, a deposition method similar to any of the above-described methods of depositing the hole transport layer using a solution may be used.

When an electron injection layer is deposited, the electron injection layer is formed by using, for example, vacuum deposition, sputtering, a printing method or the like.

(Cathode Forming Step)

The cathode is formed by using any of the above-described materials by, for example, vacuum deposition, sputtering, a CVD method, ion plating, laser ablation, or a laminating method in which a metal thin film is laminated by thermal-compression.

After the cathode is formed in the manner described above, an upper sealing film that seals the light-emitting function unit is formed to protect the light-emitting function unit having a basic structure of anode/light-emitting layer/cathode. The upper sealing film includes at least one inorganic layer and at least one organic layer as appropriate. The number of these stacked layers is determined according as appropriate, and the inorganic layers and the organic layers are basically stacked alternately.

EXAMPLES

Examples of the present invention are shown below. The examples shown below are used to describe the present invention through preferable ones, but they do not limit the present invention.

Example 1

An organic light-emitting ink was applied to a glass substrate by using a relief printing plate. As the glass substrate, a transparent glass substrate of 200 mm (height)×200 mm (width)×0.7 mm (thickness) was used.

The organic light-emitting ink was prepared by dissolving a polymer light-emitting material (product name "GP1300," product of Sumation Co., Ltd) in a solvent mixture prepared by mixing anisole and cyclohexylbenzene in a weight ratio of 1:1. The concentration of the polymer light-emitting material in the organic light-emitting ink was 1 percent by weight.

A printer used for printing was "Angstromer SDR-0023 (product name)" (product of Nissha Printing Co., Ltd., printing drum diameter: 80 mm). The printing speed was 50 mm/sec.

The depression depth for printing when the plate was in contact with the substrate was set to 0 μm, and printing was performed with the plate depressed by 50 μm from the initial depression depth position of 0 μm (the depression depth for printing=50 μm).

A flexographic printing plate made of a polyester-based resin was used as the printing plate. A plurality of grooves were formed on the surface portion of the flexographic printing plate at regular intervals. The width of the ridges (lines) in the short-side direction was 40 μm, and the width of the grooves (spaces) in the short-side direction was 40 μm (line/space=40 μm/40 μm). The height of the ridges was 15 μm.

Example 2

The organic light-emitting ink was applied to a glass substrate by the same procedure as in Example 1 except that a different flexographic printing plate was used.

A plurality of grooves were formed at regular intervals on the surface of the relief portion of the flexographic printing plate used. The width of the ridges (lines) in the short-side direction was 30 μm, and the width of the grooves (spaces) in the short-side direction was 50 μm (line/space=30 μm/50 μm). The height of the ridges was 15 μm.

Comparative Example 1

The organic light-emitting ink was applied to a glass substrate by the same procedure as in Example 1 except that a different flexographic printing plate was used. A flexographic printing plate having a flat surface (a solid printing plate) was used.

Comparative Examples 2 to 6

The organic light-emitting ink was applied to glass substrates by the same procedure as in Example 1 except that different flexographic printing plates were used. In Comparative Examples 2 to 6, halftone plates were used. In Comparative Examples 2, 3, 4, 5, and 6, halftone plates of 100/inch, 200/inch, 400/inch, 600/inch, and 900/inch were used, respectively. The heights of the dots were 15 μm.

(Evaluation)

Each printed product was irradiated with UV rays, and the intensity distribution of fluorescence (PL) from the coated film was observed under an optical microscope to evaluate the distribution of the thickness of the printed film (printing unevenness). The evaluation results are shown in Table 1.

TABLE 1

| | TYPE OF PLATE | LINE/SPACE DOT DENSITY | CONDITIONS AFTER COATING (PL EVALUATION) |
|---|---|---|---|
| EXAMPLE 1 | STRIPE PLATE | 40 μm/40 μm | o |
| EXAMPLE 2 | STRIPE PLATE | 30 μm/50 μm | o |
| COMPARATIVE EXAMPLE 1 | BALD PLATE | — | x |
| COMPARATIVE EXAMPLE 2 | HALFTONE PLATE | 100/INCH | x |
| COMPARATIVE EXAMPLE 3 | HALFTONE PLATE | 200/INCH | x |
| COMPARATIVE EXAMPLE 4 | HALFTONE PLATE | 400/INCH | x |
| COMPARATIVE EXAMPLE 5 | HALFTONE PLATE | 600/INCH | x |
| COMPARATIVE EXAMPLE 6 | HALFTONE PLATE | 900/INCH | x |

In Table 1, the open circle mark "o" denotes that no printing unevenness was found, and the cross mark "x" denotes that printing unevenness was found.

As can be seen from the above results, by forming a plurality of grooves on the surface of the relief portion of the relief printing plate, the organic light-emitting ink can be applied at a uniform thickness.

INDUSTRIAL APPLICABILITY

As described above, according to the present invention, it is possible to efficiently produce an organic EL element that exhibits an excellent light-emission characteristic of preventing light emitting unevenness or light-emission failure on its light-emitting surface, and produce a lighting device including the organic EL element.

The invention claimed is:

1. A method of producing a lighting device that comprises an organic electroluminescent element comprising at least an anode, a cathode, and an organic light-emitting layer placed between the cathode and the anode, the method comprising:

a process for producing the organic electroluminescent element, the process comprising an organic light-emitting layer formation step for forming an organic light-emitting layer by applying an organic light-emitting ink comprising an organic light-emitting material and a solvent to a light-emitting layer formation region on which the organic light-emitting layer is to be formed, by using a relief printing plate, wherein the relief printing plate has a relief portion, an outline of surface of the relief portion is substantially the same as an outline of the light-emitting layer formation region, an area of the surface of the relief portion is 1 cm×1 cm or more, a plurality of ridges and grooves are formed on the surface of the relief portion configured to be arranged in a strip pattern being parallel to the printing direction of relief printing, at least one longitudinal end of the plurality of grooves opens in a side surface of the relief portion, a width of the ridge is 10 μm to 100 μm, and a width of the groove is 10 μm to 100 μm.

2. A lighting device comprising the organic electroluminescent element according to claim 1.

* * * * *